United States Patent
Yang et al.

(10) Patent No.: US 12,088,298 B2
(45) Date of Patent: Sep. 10, 2024

(54) COMPUTING APPARATUS TRIGGERED BY AN EDGE OF A SUPPLY-LINE SIGNAL WITH A PULSE WIDTH COUNTER

(71) Applicant: HANGZHOU YUN LED CHIP PHOTOELECTRICITY TECH. CO., LTD., Hangzhou (CN)

(72) Inventors: Yinghan Yang, Hangzhou (CN); Zixun Zhang, Hangzhou (CN)

(73) Assignee: HANGZHOU YUN LED CHIP PHOTOELECTRICITY TECH CO., LTD., Zhejiang (CN)

( * ) Notice: Subject to any disclaimer, the term of this patent is extended or adjusted under 35 U.S.C. 154(b) by 0 days.

(21) Appl. No.: 18/042,208

(22) PCT Filed: Jul. 23, 2021

(86) PCT No.: PCT/CN2021/108097
§ 371 (c)(1),
(2) Date: Feb. 17, 2023

(87) PCT Pub. No.: WO2022/042155
PCT Pub. Date: Mar. 3, 2022

(65) Prior Publication Data
US 2023/0327675 A1    Oct. 12, 2023

(30) Foreign Application Priority Data
Aug. 28, 2020    (CN) .......................... 202010885787.X

(51) Int. Cl.
*H03K 21/00* (2006.01)
*H03K 3/037* (2006.01)
*H05B 45/32* (2020.01)

(52) U.S. Cl.
CPC ............. *H03K 21/00* (2013.01); *H03K 3/037* (2013.01); *H05B 45/32* (2020.01)

(58) Field of Classification Search
CPC ......... H03K 3/037; H03K 21/00; H05B 45/32
(Continued)

(56) References Cited

U.S. PATENT DOCUMENTS

| 11,029,721 B2 * | 6/2021 | Huang ...................... G06F 1/12 |
| 2016/0338157 A1 * | 11/2016 | Kurishita ............. H05B 45/397 |

FOREIGN PATENT DOCUMENTS

| CN | 104202040 A | 12/2014 |
| CN | 108882465 A | 11/2018 |
| CN | 112087839 A | 12/2020 |

OTHER PUBLICATIONS

International Search Report in Application No. PCT/CN2021/108097, mailed on Oct. 25, 2021.
(Continued)

*Primary Examiner* — William Hernandez
(74) *Attorney, Agent, or Firm* — Syncoda LLC; Feng Ma

(57) ABSTRACT

A computing apparatus triggered by an edge of a supply-line signal with a pulse width counter includes: a clock circuit to supply clock signals to a pulse width counter from an output port of said clock circuit; said pulse width counter triggered by said clock signals to count the pulse width of a supply-line signal from a power supply line, to set a circuit status of said computing apparatus in accordance with said pulse width, and to output said circuit status to an edge-triggered computing unit; and the edge-triggered computing unit to do computing triggered by an edge of a supply-line signal, and to output computing result as the output of said computing apparatus in accordance with said circuit status. The circuit status of the computing apparatus is set in accordance with pulse width counter of supply-line signals.

12 Claims, 4 Drawing Sheets

(58) Field of Classification Search
USPC .................................. 327/24, 26, 31, 199
See application file for complete search history.

(56) References Cited

OTHER PUBLICATIONS

China written opinion in Application No. PCT/CN2021/108097, mailed on Oct. 25, 2021.

* cited by examiner

COMPUTING APPARATUS TRIGGERED BY AN EDGE OF A SUPPLY-LINE SIGNAL WITH A PULSE WIDTH COUNTER

CROSS-REFERENCE TO RELATED APPLICATIONS

The present application is a national stage of International Patent Application No. PCT/CN2021/108097 filed on Jul. 23, 2021, which claims priority to Chinese Patent Application No. 202010885787.X filed on Aug. 28, 2020. The disclosures of the above-referenced applications are hereby incorporated by reference in their entirety.

TECHNICAL FIELDS

The present invention relates to the technical field of LED control. The present invention further relates to a computing apparatus triggered by an edge of a supply-line signal with a pulse width counter.

BACKGROUND

At present, LED lights on the market can be in a steady mode, or in a flickering mode. LED lights in a steady mode are easier to manufacture, but with monotonous decoration effects. Those methods to manufacture LED lights in flickering mode include: LED flashing bulbs are installed in series at intervals between steady mode LEDs to work in a fixed mode without other modes controlled by signals; LED lights are divided into several groups, controlled by controllers for each group. To make the LED lights work as water flowing, it must be adapted for over 3-channel structure, the more channels and the better effects of lights.

The mode of dividing an LED light into several LED groups requires connecting those LEDs that lights at the same time in series, and then connecting each LED group in parallel. The more channels of the LED light are used, the more complex structure, the more electric wires, the more difficult to manufacture, the higher cost, the larger size, the more various parts, and the higher cost of the products.

On the market, lighting products based on the patents "Computing apparatus and LED driver triggered by signal edges from power supply line" and "Colorful light apparatus based on signal edges from power supply line" (Chinese Invention Patent ZL201410632645.7, and Chinese invention patent ZL201410775449.5) are widely used in mass for high cost performance. However, the lighting effects of these LED drivers and these products are monotonous because all LED drivers in these products do the same computation. These do not meet with the requirement for more vivid lighting effects.

Technical Problems

The present invention is to provide a computing apparatus triggered by an edge of a supply-line signal with a pulse width counter. The problem of not having a pulse width of a supply-line signal is solved when a computation is triggered by an edge of a supply-line signal.

SUMMARY

A computing apparatus triggered by an edge of a supply-line signal with a pulse width counter, comprising:
a clock circuit for supplying clock signals to a pulse width counter from an output port of said clock circuit;
said pulse width counter is triggered by said clock signals to count the pulse width of a supply-line signal from a power supply line, is to set a circuit status of said computing apparatus in accordance with said pulse width, and is to output said circuit status of said computing apparatus to an edge-triggered computing unit;
and said edge-triggered computing unit is to do computation triggered by an edge of said supply-line signal, and is to output a computing result as an output of said computing apparatus in accordance with said circuit status.

Said pulse width counter is to count the high pulse width of said supply-line signal, to count the low pulse width of said supply-line signal, or to count both the high pulse width and the low pulse width of said supply-line signal in the invention patent. As a preferred embodiment, said pulse width counter is to count the high pulse width of said supply-line signal in the invention patent.

Said edge-triggered computing unit is to do computation triggered by the edge of said supply-line signal from said power supply line. Said edge of said supply-line signal is a falling edge from a high voltage level to a low voltage level, or a rising edge from a low voltage level to a high voltage level. As a preferred embodiment, said edge of said supply-line signal is a rising edge from a low voltage level to a high voltage level.

As in preferred embodiments, said computing apparatus comprises a charging unit for supplying power to said pulse width counter and said edge-triggered computing unit based on said supply-line signal from said power supply line; said charging unit is charged when said supply-line signal from said power supply line is at a high voltage, and is discharged when said supply-line signal from said power supply line is at a low voltage.

In other embodiments, said pulse width counter is powered directly from said power supply line.

As in preferred embodiments, said charging unit comprises a unidirectional conductive component; an anode of said unidirectional conductive component is connected to said power supply line; a cathode of said unidirectional conductive component is connected to ground via a power storage component; said charging unit is for supplying power to said pulse width counter and said edge-triggered computing unit via said cathode.

As in preferred embodiments, said clock circuit is for providing clock signals when said supply-line signal is at a high voltage, and is not for providing clock signals when said supply-line signal is at a low voltage.

As in preferred embodiments, said clock circuit is powered by said power supply line; said clock circuit stops providing said clock signals when said supply-line signal from said power supply line is at low voltage; said clock circuit supplies clock signals when said supply-line signal from said power supply line is at high voltage. As in preferred embodiments, said clock circuit comprises an enable port electrically connected to said power supply line; said clock circuit stops providing clock signals when said supply-line signal from said power supply line is at low voltage; said clock circuit provides clock signals when said supply-line signal from said power supply line is at high voltage.

As in preferred embodiments, said pulse width counter is to do counting when said supply-line signal is at a high voltage.

As in preferred embodiments, said circuit status of said computing apparatus comprises a counting status triggered by supply-line signal and a counted status triggered by supply-line signal.

As in preferred embodiments, said pulse width counter comprises a previous-counted-pulse-width memory circuit for storing a previous counted pulse width, and to output said previous counted pulse width.

As in preferred embodiments, said pulse width counter comprises:
- an asynchronous reset circuit: an asynchronous reset port of said asynchronous reset circuit is electrically connected to said power supply line; an output port of said asynchronous reset circuit is reset to logic Zero when the voltage of said supply-line signal is at low; a clock port of said asynchronous reset circuit is electrically connected to said output port of said clock circuit; the output port of said asynchronous reset circuit is set to logic One after an active clock edge when the voltage of said supply-line signal is at high;
- and a synchronous pulse width counting circuit: a synchronous reset port of said synchronous pulse width counting circuit is electrically connected to said output port of said asynchronous reset circuit; a clock port of said synchronous pulse width counting circuit is electrically connected to said output port of said clock circuit; an output port of said synchronous pulse width counting circuit is reset to logic Zero after an active clock edge when said synchronous reset port of said synchronous pulse width counting circuit is logic Zero; said synchronous pulse width counting circuit is to do counting after an active clock edge when said synchronous reset port of said synchronous pulse width counting circuit is logic One.

As in preferred embodiments, it is to do incremental counting.

It should be understood that said incremental counting is a preferred mode to count the pulse width of said supply-line signal. Other counting modes, such as adding two counting or other value counting, are also within the scope of the invention.

As in preferred embodiments, the value of said synchronous pulse width counting circuit is compared with the value of said previous-counted-pulse-width memory circuit when said output port of said asynchronous reset circuit is reset to logic Zero after an active clock edge; said circuit status of said computing apparatus is set to said counted status triggered by supply-line signal when the comparison condition between said value of said synchronous pulse width counting circuit and said value of said previous-counted-pulse-width memory circuit is met; said circuit status of said computing apparatus is set to said counting status triggered by supply-line signal when the comparison condition between said value of said synchronous pulse width counting circuit and said value of said previous-counted-pulse-width memory circuit is not met.

As in preferred embodiments, said comparison condition is greater-smaller relational condition: said circuit status of said computing apparatus is set to said counted status triggered by supply-line signal when said value of said synchronous pulse width counting circuit is greater than said value of said previous-counted-pulse-width memory circuit; said circuit status of said computing apparatus is set to said counting status triggered by supply-line signal when said value of said synchronous pulse width counting circuit is not greater than said value of said previous-counted-pulse-width memory circuit.

As in preferred embodiments, the value of said synchronous pulse width counting circuit is stored in said previous-counted-pulse-width memory circuit when the output port of said asynchronous reset circuit is at logic Zero after active clock edge.

It is to do digital computation, to do analog computation, or to do digital-analog mixed computation for said edge-triggered computing unit triggered by an edge of a supply-line signal.

As in preferred embodiments, said edge-triggered computing unit is to do counting triggered by said edge of said supply-line signal from said power supply line; said edge-triggered computing unit comprises a plurality of D-flip-flops, and outputs the counting result via the output ports of said plurality of D-flip-flops; a clock input port of the first D-flip-flop is connected to said power supply line, and among the remaining two D-flip-flops, a clock input port of a D-flip-flop is connected to a QB output port of its preceding D-flip-flop.

As in preferred embodiments, it is to do arithmetic-logical operation for said edge-triggered computing unit triggered by said edge of said supply-line signal.

Said edge-triggered computing unit comprises n D-flip-flops connected in parallel, and one k-bit arithmetic and logic unit; said n is equal to said k; and said edge-triggered computing unit outputs the computing result via the output ports of said n D-flip-flops;
- D input ports of said n D-flip-flops are connected to output ports of the arithmetic and logic unit;
- clock ports of n D-flip-flops are connected to said power supply line; A-group input ports of the arithmetic and logic unit are connected to Q output ports of the n D-flip-flops, bit by bit; B-group input ports of the arithmetic and logic unit are to receive an external pattern control constant.

In the invention patent, said circuit status of said computing apparatus is set in accordance with the pulse width of a supply-line signal counted by a pulse width counter, and said computing result of said computing apparatus is output in accordance with said circuit status of said computing apparatus. The problem without a pulse width for high pulse or low pulse of a supply-line signal is solved when a computation is triggered by a supply-line signal. Thus, more lighting effects can be implemented in lights based on the invention and other support circuits than in those lights which are only triggered by a supply-line signal from a power supply line.

DETAILED DESCRIPTION

In the following, with reference to the drawings of various embodiments disclosed herein, the technical solutions of the embodiments of the disclosure will be described in a clear and fully understandable way.

Figure 1:
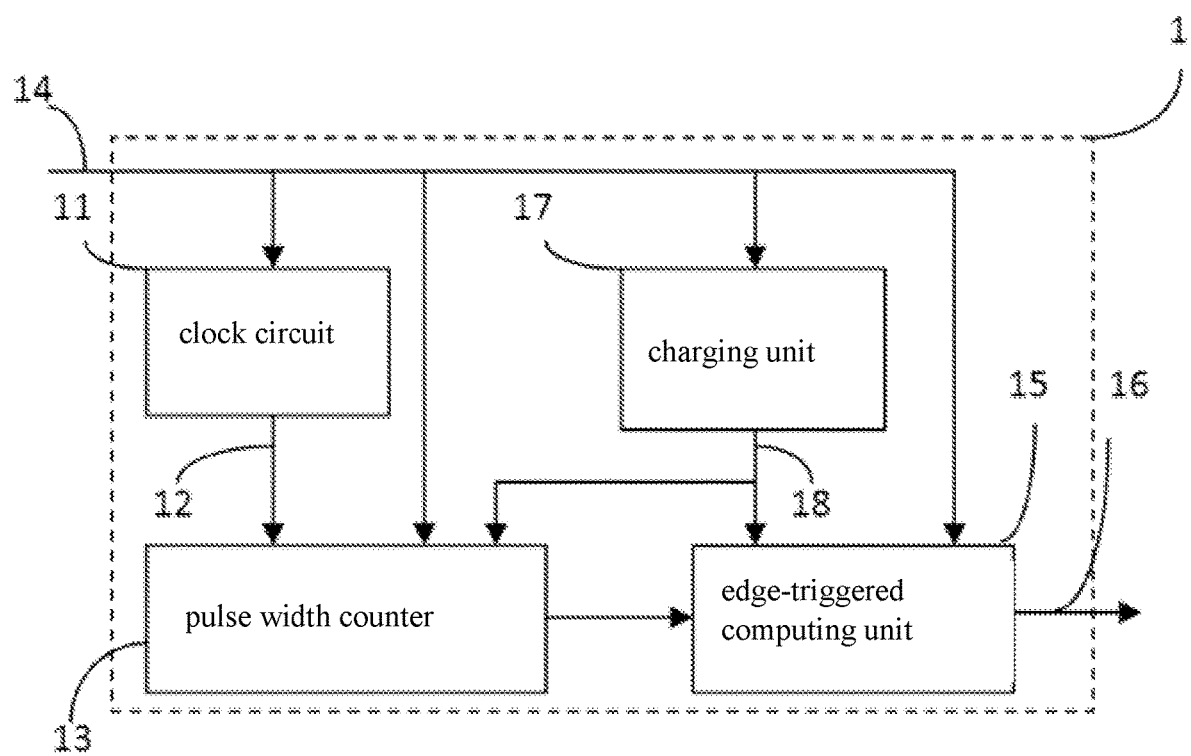
FIG. 1 illustrates a computing apparatus triggered by an edge of a supply-line signal with a pulse width counter.

As illustrated in FIG. 1, a computing apparatus (1) triggered by an edge of a supply-line signal with a pulse width counter in the implemented embodiment, comprises:

a clock circuit (11) for supplying clock signals to a pulse width counter (13) from the output port (12) of the clock circuit (11); the pulse width counter (13) clocked by the clock signals to count the pulse width of a supply-line signal from a power supply line (14), to set the circuit status of the computing apparatus (1) in accordance with the pulse width, and to output the circuit status of the computing apparatus (1) to an edge-triggered computing unit (15) in accordance with the pulse width; the edge-triggered computing unit (15) to do computation triggered by an edge of a supply-line signal from the power supply line (14), and to output computing result as the output (16) of the computing apparatus (1) in accordance with the circuit status; a charging unit (17) to supply power (18) to the pulse width counter (13) and the edge-triggered computing unit (15) in accordance with the supply-line signal from the power supply line (14); the charging unit (17) is charged when the supply-line signal from the power supply line is at a high voltage, and is discharged when the supply-line signal from the power supply line is at a low voltage.

In the implemented embodiment, the clock circuit (11) is powered by the power supply line (14). The clock circuit (11) supplies clock signals when the supply-line signal is at high voltage, and does not to supply clock signals when the supply-line signal is at low voltage. In the implemented embodiment, the clock circuit (11), the pulse width counter (13), the edge-triggered computing unit (15), and the charging unit (17) are connected to a common ground.

In the implemented embodiment, the circuit status of the computing apparatus (1) comprises a counting status triggered by a supply-line signal and a counted status triggered by supply-line signal.

Figure 2:
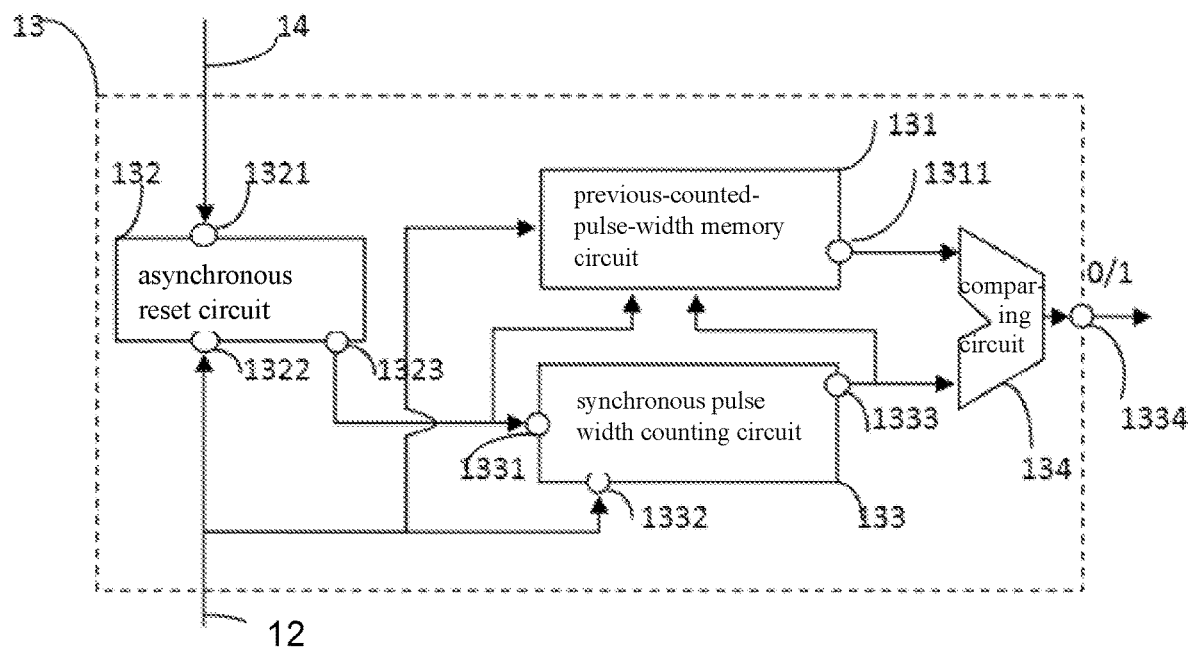
FIG. 2 illustrates a pulse width counter in the implemented embodiment.

As illustrated in FIG. 2, the pulse width counter (13) in the implemented embodiment comprises a previous-counted-pulse-width memory circuit (131), an asynchronous reset circuit (132), and a synchronous pulse width counting circuit (133).

The previous-counted-pulse-width memory circuit (131) is for storing a previous counted pulse width, and outputting said previous counted pulse width from the output port (1311) to a comparing circuit (134); the output port (1323) of the asynchronous reset circuit (132) and the output port (12) of the clock circuit (11) are electrically connected to the previous-counted-pulse-width memory circuit (131). The asynchronous reset port (1321) of the asynchronous reset circuit (132) is electrically connected to the power supply line (14); the clock port (1322) of the asynchronous reset circuit (132) is electrically connected to the output port (12) of the clock circuit (11) to receive clock signal. The output port (1323) of the asynchronous reset circuit (132) is reset to logic Zero when the voltage of the supply-line signal from the power supply line (14) is low; the output port (1323) of said asynchronous reset circuit (132) is set to logic One after an active clock edge from the clock port (1322) circuit when voltage the supply-line signal from of the power supply line (14) from the asynchronous reset port (1321) is high. The synchronous reset port (1331) of said synchronous pulse width counting circuit (133) is electrically connected to the output port (1323) of the asynchronous reset circuit (132), the clock port (1332) of the synchronous pulse width counting circuit (133) is electrically connected to the output port (12) of the clock circuit (11) to receive clock signals; the output port (1333) of the synchronous pulse width counting circuit (133) is reset to logic Zero after an active clock edge from the clock port (1332) when the synchronous reset port (1331) is logic Zero; the synchronous pulse width counting circuit (133) is to do incremental counting and to output the counting value from the output port (1333) after an active clock edge from the clock port (1332) when said synchronous reset port (1331) is logic One. The counting value from the synchronous pulse width counting circuit (133) is output to the comparing circuit (134) as the pulse width counting value.

In the implemented embodiment, the counting value of the synchronous pulse width counting circuit (133) is compared with the counting value of the previous-counted-pulse-width memory circuit (131) by the comparing circuit (134) when the output port (1323) of the asynchronous reset circuit (132) is logic Zero after an active clock edge: the circuit status of the computing apparatus (1) is set to a counted status triggered by supply-line signal (logic One) when the counting value of the synchronous pulse width counting circuit (133) is greater than the counting value of the previous-counted-pulse-width memory circuit (131); the circuit status of the computing apparatus (1) is set to a counting status triggered by supply-line signal (logic Zero) when the counting value of the synchronous pulse width counting circuit (133) is not greater than the counting value of the previous-counted-pulse-width memory circuit (131). The circuit status of the computing apparatus (1) is output to the edge-triggered computing unit (15) from the output port (1334) of the pulse width counter (13).

In the implemented embodiment, the value of the synchronous pulse width counting circuit (133) is stored in the previous-counted-pulse-width memory circuit (131) when the output port (1323) of the asynchronous reset circuit (132) is at logic Zero after an active clock edge.

Figure 3:
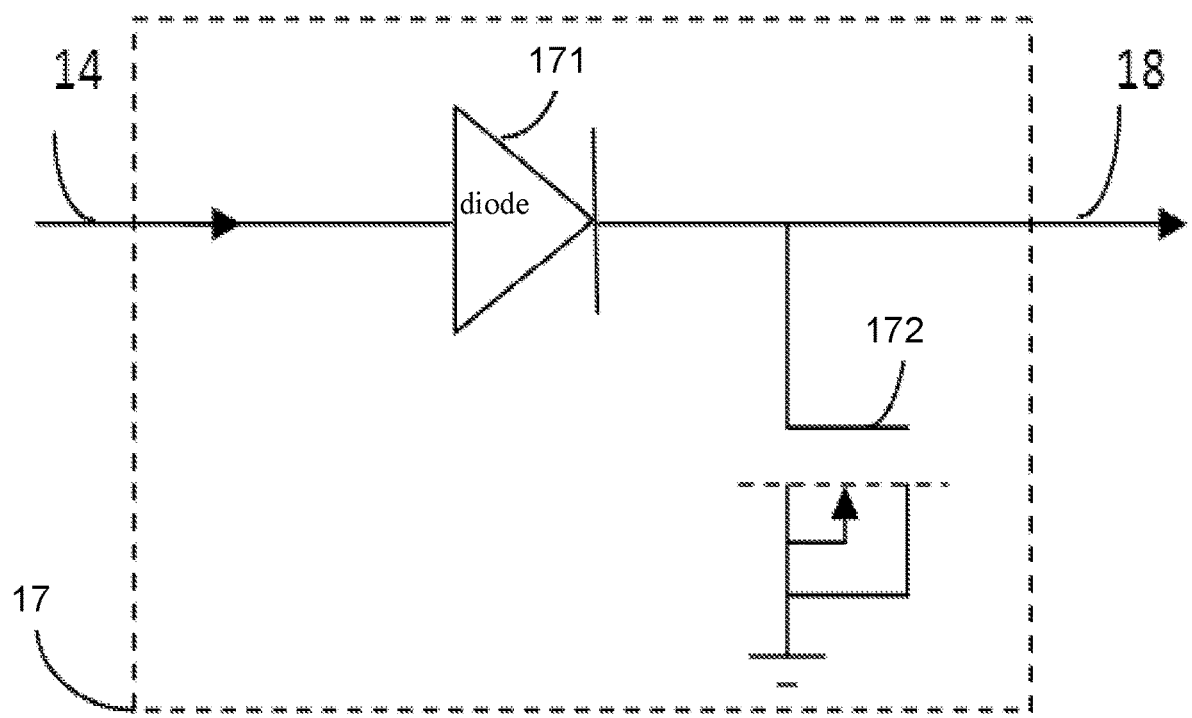
FIG. 3 illustrates a charging unit in the implemented embodiment.

FIG. 3 illustrates an implemented circuit of the charging unit (17) of the implemented embodiment, which comprises a diode, D (171), with the anode connected to the power supply line (14), and its cathode connected to ground via a power storage component C (172) (in the implemented embodiment the charging capacitor is an equivalent capacitor formed by connecting the source and the drain together of a MOSFET, whose capacitance is 0.2 μF). The charging unit supplies power to the pulse width counter and the edge-triggered computing unit via the cathode of the diode D.

Figure 4:
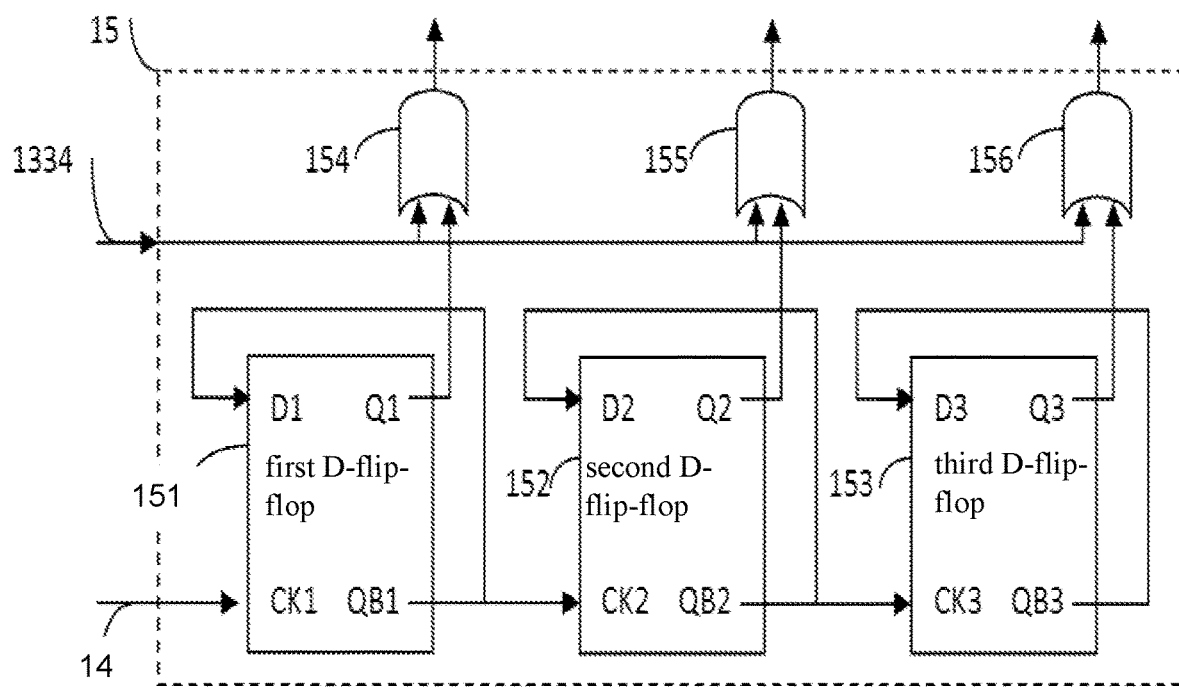
FIG. 4 illustrates an edge-triggered computing unit to do computation triggered by an edge of a supply-line signal in the implemented embodiment.

FIG. 4 illustrates an implemented circuit of the edge-triggered computing unit (15) in the implemented embodiment which comprises three D-flip-flops. The three D-flip-flops are the first D-flip-flop (151), the second D-flip-flop (152) and the third D-flip-flop (153), with the output ports Q1, Q2 and Q3 respectively, and the counting results from low bit to high bit are Q1, Q2 and Q3 respectively. The clock input port CK1 of the first D-flip-flop (151) is connected to the power supply line (14), and its reverse output port QB1 is connected to the clock input port CK2 of the second D-flip-flop (152), while the reverse output port QB2 of the second D-flip-flop (152) is connected to the clock input port CK3 of the third D-flip-flop (153). The reverse output port of each D-flip-flop is connected to the its own D input port (meaning the reverse output port QB1 is connected to the D input port D1, the reverse output port QB2 is connected to the D input D2, and the reverse output port QB3 is connected to the D input D3). The edge-triggered computing unit (15) in the implemented embodiment also comprises three AND gates: AND gate 154, AND gate 155, AND gate 156. One input port of AND gate 154, one input port of AND gate 155, and one input port of AND gate 156 are connected in parallel to the output port 1334 of the pulse width counter (13); the other input port of AND gate 154, the other input port of AND gate 155, and the other input port of AND gate 156 are connected to the output port Q1, the output port Q2, and the output port Q3 of the three D-flip-flops respectively. When the circuit status triggered by supply-line signal is the counting status (logic 0), the outputs of the computing apparatus (1) are logic zero for Q1, Q2 and Q3 are not output from the three AND gates; when the circuit status triggered by supply-line signal is the counted status (logic 1), the outputs of the computing apparatus (1) are output from Q1, Q2 and Q3.

In the implemented embodiment, the circuit status of the computing apparatus is set in accordance with the pulse width counted by the pulse width counter, and the computing result triggered by the edge of the supply-line signal is output in accordance with the circuit status of the computing apparatus. The problem of no circuit status of the computing apparatus is solved when a computation is triggered by a supply-line signal. As a result, the more lighting effects can be implemented in lights based on the present invention and other supporting circuits than in those lights which are only triggered by a supply-line signal from a power supply line.

It is only a preferred embodiment which is not intended to limit the invention patent. Based on the described embodiments of the disclosure, any other embodiment(s), which come(s) from any modification, substitution, and improvement within the scope should be sought for protection by the disclosure.

What is claimed is:

1. A computing apparatus triggered by an edge of a supply-line signal with a pulse width counter, comprising:
    a clock circuit for supplying clock signals to the pulse width counter from an output port of said clock circuit;
    said pulse width counter is triggered by said clock signals to measure a pulse width of the supply-line signal from a power supply line, to set a circuit status of said computing apparatus in accordance with said pulse width, and to output said circuit status of said computing apparatus to an edge-triggered computing unit;
    and said edge-triggered computing unit is to do computation triggered by an edge of said supply-line signal, and is to output a computing result as an output of said computing apparatus in accordance with said circuit status.

2. The computing apparatus of claim 1, wherein said computing apparatus comprising:
    a charging unit for supplying power to said pulse width counter and said edge-triggered computing unit based on said supply-line signal from said power supply line;
    said charging unit is charged when said supply-line signal from said power supply line is at a high voltage, and is discharged when said supply-line signal from said power supply line is at a low voltage.

3. The computing apparatus of claim 2, wherein said charging unit comprises a unidirectional conductive component; an anode of said unidirectional conductive component is connected to said power supply line; a cathode of said unidirectional conductive component is connected to ground via a power storage component; said charging unit is for supplying power to said pulse width counter and said edge-triggered computing unit via said cathode.

4. The computing apparatus of claim 1, wherein said clock circuit is for providing clock signals when said supply-line signal is at a high voltage, and is not for providing clock signals when said supply-line signal is at a low voltage.

5. The computing apparatus of claim 1, wherein said circuit status of said computing apparatus comprises a counting status triggered by the supply-line signal and a counted status triggered by the supply-line signal.

6. The computing apparatus of claim 5, wherein said pulse width counter comprises:
    a previous-counted-pulse-width memory circuit for storing a previous counted pulse width, and to output said previous counted pulse width.

7. The computing apparatus of claim 6, wherein said pulse width counter comprises:
    an asynchronous reset circuit: an asynchronous reset port of said asynchronous reset circuit is electrically connected to said power supply line; an output port of said asynchronous reset circuit is reset to logic Zero when the voltage of said supply-line signal is at low; a clock port of said asynchronous reset circuit is electrically connected to said output port of said clock circuit; the output port of said asynchronous reset circuit is set to logic One after an active clock edge when the voltage of said supply-line signal is at high;
    a synchronous pulse width counting circuit: a synchronous reset port of said synchronous pulse width counting circuit is electrically connected to said output port of said asynchronous reset circuit, a clock port of said synchronous pulse width counting circuit is electrically connected to said output port of said clock circuit; an output port of said synchronous pulse width counting circuit is reset to logic Zero after an active clock edge when said synchronous reset port of said synchronous pulse width counting circuit is logic Zero; said synchronous pulse width counting circuit is to do counting after an active clock edge when said synchronous reset port of said synchronous pulse width counting circuit is logic One.

8. The computing apparatus of claim 7, wherein a value from said synchronous pulse width counting circuit is compared with a value from said previous-counted-pulse-width memory circuit when said output port of said asynchronous reset circuit is reset to logic Zero after an active clock edge;
    said circuit status of said computing apparatus is set to said counted status triggered by the supply-line signal when the comparison condition between said value from said synchronous pulse width counting circuit and said value from said previous-counted-pulse-width memory circuit is met; said circuit status of said computing apparatus is set to said counting status triggered by the supply-line signal when the comparison condition between said value from said synchronous pulse width counting circuit and said value from said previous-counted-pulse-width memory circuit is not met.

9. The computing apparatus of claim 8, wherein said comparison condition is a greater-smaller relational condition;
    said circuit status of said computing apparatus is set to said counted status triggered by the supply-line signal when said value from said synchronous pulse width counting circuit is greater than said value from said previous-counted-pulse-width memory circuit; said circuit status of said computing apparatus is set to said counting status triggered by the supply-line signal when said value from said synchronous pulse width counting circuit is not greater than said value from said previous-counted-pulse-width memory circuit.

10. The computing apparatus of claim 9, wherein said value from said synchronous pulse width counting circuit is stored in said previous-counted-pulse-width memory circuit when said output port of said asynchronous reset circuit is reset to logic Zero after an active clock edge.

11. The computing apparatus of claim 1, wherein said edge-triggered computing unit is to do counting triggered by said edge of said supply-line signal from said power supply line, said edge-triggered computing unit comprises a plurality of D-flip-flops, and outputs the counting result via the output ports of said plurality of D-flip-flops;

a clock input port of a first D-flip-flop is connected to said power supply line, and among remaining two D-flip-flops, a clock input port of a D-flip-flop is connected to a QB output port of its preceding D-flip-flop.

12. The computing apparatus of claim 11, wherein said edge-triggered computing unit comprises n D-flip-flops connected in parallel, and one k-bit arithmetic and logic unit; said n is equal to said k; and said edge-triggered computing unit outputs the computing result via the output ports of said n D-flip-flops;

D input ports of said n D-flip-flops are connected to output ports of the arithmetic and logic unit; A-group input ports of the arithmetic and logic unit are connected to the outputs of the n D-flip-flops, bit by bit; B-group input ports of the arithmetic and logic unit are to receive an external pattern control constant.

* * * * *